United States Patent
Cheng et al.

(10) Patent No.: US 7,651,735 B2
(45) Date of Patent: *Jan. 26, 2010

(54) ORIENTING, POSITIONING, AND FORMING NANOSCALE STRUCTURES

(75) Inventors: Joy Cheng, San Jose, CA (US); Ho-Cheol Kim, San Jose, CA (US); Robert D. Miller, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/061,777

(22) Filed: Apr. 3, 2008

(65) Prior Publication Data

US 2008/0233343 A1   Sep. 25, 2008

Related U.S. Application Data

(63) Continuation of application No. 11/690,295, filed on Mar. 23, 2007.

(51) Int. Cl.
*B05D 5/00* (2006.01)
(52) U.S. Cl. ........... 427/256; 427/384; 427/388.2; 427/447
(58) Field of Classification Search ........... 427/256, 427/384, 388.2, 447
See application file for complete search history.

(56) References Cited

U.S. PATENT DOCUMENTS

| | | | |
|---|---|---|---|
| 6,030,706 A | 2/2000 | Eissa et al. | |
| 6,421,472 B1 | 7/2002 | Moroni et al. | |
| 6,777,813 B2 | 8/2004 | Juengling et al. | |
| 6,893,705 B2 | 5/2005 | Thomas et al. | |
| 6,911,400 B2 | 6/2005 | Colburn et al. | |
| 7,090,784 B2 | 8/2006 | Asakawa et al. | |
| 2003/0118800 A1 | 6/2003 | Thomas et al. | |
| 2005/0208752 A1* | 9/2005 | Colburn et al. | 438/619 |
| 2006/0134556 A1 | 6/2006 | Nealey et al. | |
| 2006/0231525 A1* | 10/2006 | Asakawa et al. | 216/56 |
| 2006/0246681 A1 | 11/2006 | Li et al. | |
| 2007/0289943 A1 | 12/2007 | Lu et al. | |
| 2008/0103256 A1* | 5/2008 | Kim et al. | 525/88 |
| 2008/0176767 A1* | 7/2008 | Millward | 506/20 |
| 2008/0193658 A1* | 8/2008 | Millward | 427/401 |
| 2008/0233323 A1* | 9/2008 | Cheng et al. | 428/36.91 |

OTHER PUBLICATIONS

Park, et al., "Enabling Nanotechnology with Self Assembled Block Copolymer Patterns," Polymer 44 (2003), pp. 6725-6760.

* cited by examiner

*Primary Examiner*—Binh X Tran
(74) *Attorney, Agent, or Firm*—Schmeiser, Olsen & Watts

(57) ABSTRACT

Methods and a structure. A first film of a first block copolymer is formed inside a trough integrally disposed on an energetically neutral surface layer of a substrate. Line-forming microdomains are assembled of the first block copolymer, and form first self-assembled structures within the first film normal to the sidewalls and parallel to the surface layer. At least one microdomain is removed from the first film such that oriented structures remain in the trough oriented normal to the sidewalls and parallel to the surface layer. A second film of a second block copolymer is formed inside the trough. Line-forming microdomains are assembled of the second block copolymer, and form second self-assembled structures within the second film oriented normal to the oriented structures and parallel to the sidewalls. A second method and a structure are also provided.

15 Claims, 9 Drawing Sheets

ORIENTING, POSITIONING, AND FORMING NANOSCALE STRUCTURES

This application is a continuation application claiming priority from Ser. No. 11/690,295 filed Mar. 23, 2007.

FIELD OF THE INVENTION

The invention relates to methods for aligning microdomains of block copolymers on substrates and structures formed therefrom.

BACKGROUND OF THE INVENTION

Miniaturization is a driving force to improve device performance and reduce cost for chip manufacturing. Current lithographic techniques are based on a "top-down" approach, wherein patterns are imaged onto a resist via optical projection through a predefined mask. However it is becoming increasingly difficult and expensive to extend this approach to create patterns with dimensions on the nanometer scale. Accordingly, there exists a need for a practical and economical approach to create patterns with dimensions on the nanometer scale.

SUMMARY OF THE INVENTION

The present invention relates to a method, comprising:
forming a first film inside at least one trough, said at least one trough integrally disposed on an energetically neutral surface layer of a substrate, said at least one trough comprising a substantially planar first sidewall and a substantially planar second sidewall opposite said first sidewall, wherein said first sidewall and said second sidewall are substantially normal to said surface layer, said first and said second sidewalls being separated by a distance corresponding to a width of a bottom surface of said at least one trough, said first film comprising a first block copolymer;
assembling line-forming microdomains of said first block copolymer within said first film, said microdomains of said first block copolymer forming first self-assembled structures within said first film, said first self-assembled structures oriented substantially normal to said first sidewall and said second sidewall and substantially parallel to said surface layer;
removing at least one microdomain from said first film such that oriented structures remain in said trough, wherein said oriented structures are oriented substantially normal to said first sidewall and said second sidewall and substantially parallel to said surface layer;
forming a second film inside said at least one trough, said second film comprising a second block copolymer; and
assembling line-forming microdomains of said second block copolymer within said second film, said line-forming microdomains of said second block copolymer forming second self-assembled structures within said second film, said second self-assembled structures oriented substantially normal to said oriented structures and substantially parallel to said first sidewall and said second sidewall.

The present invention relates to a structure, comprising:
a substrate having a surface layer, said surface layer configured to induce a block copolymer to form line-forming microdomains, said surface having at least one trough integrally disposed thereon, said at least one trough comprising a substantially planar first sidewall and a substantially planar second sidewall opposite said first sidewall, wherein said first sidewall and said second sidewall are substantially normal to said surface layer, said first and said second sidewalls being separated by a distance corresponding to a width of a bottom surface of said at least one trough;
at least one oriented inorganic structure disposed inside said at least one trough, said at least one structure oriented substantially normal to said first sidewall and said second sidewall and substantially normal to said surface layer; and
a block copolymer film disposed in said at least one trough, wherein said block copolymer comprises a first block comprising a first polymer, said first block being covalently bonded to a second block comprising a second polymer to form a repeating unit of the block copolymer, said first and second polymers being different, wherein line-forming microdomains of said block copolymer are aligned substantially parallel to said first and second sidewalls and substantially normal to said at least one oriented inorganic structure.

The present invention relates to a method, comprising:
forming a film in at least one trough, said at least one trough having at least one first oriented structure disposed therein, said at least one trough integrally disposed on a surface layer of a substrate, said surface layer configured to induce a block copolymer to form line-forming microdomains, said at least one trough comprising a substantially planar first sidewall and a substantially planar second sidewall opposite said first sidewall, wherein said first sidewall and said second sidewall are substantially normal to said surface layer, said first and said second sidewalls being separated by a distance corresponding to a width of a bottom surface of said at least one trough, said at least one first oriented structure oriented substantially normal to said first sidewall and said second sidewall and substantially parallel to said surface layer, said film comprising a block copolymer, said block copolymer comprising line-forming microdomains of a first polymer block and lamellar microdomains of a second polymer block; and
removing at least one microdomain from said film such that at least one second oriented structure remains in said at least one trough, wherein said at least one second oriented structure is oriented substantially normal to said at least one first oriented structure and substantially parallel to said first sidewall and said second sidewall.

The present invention provides a practical and economical approach to create patterns with dimensions on the nanometer scale.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Figure 1:
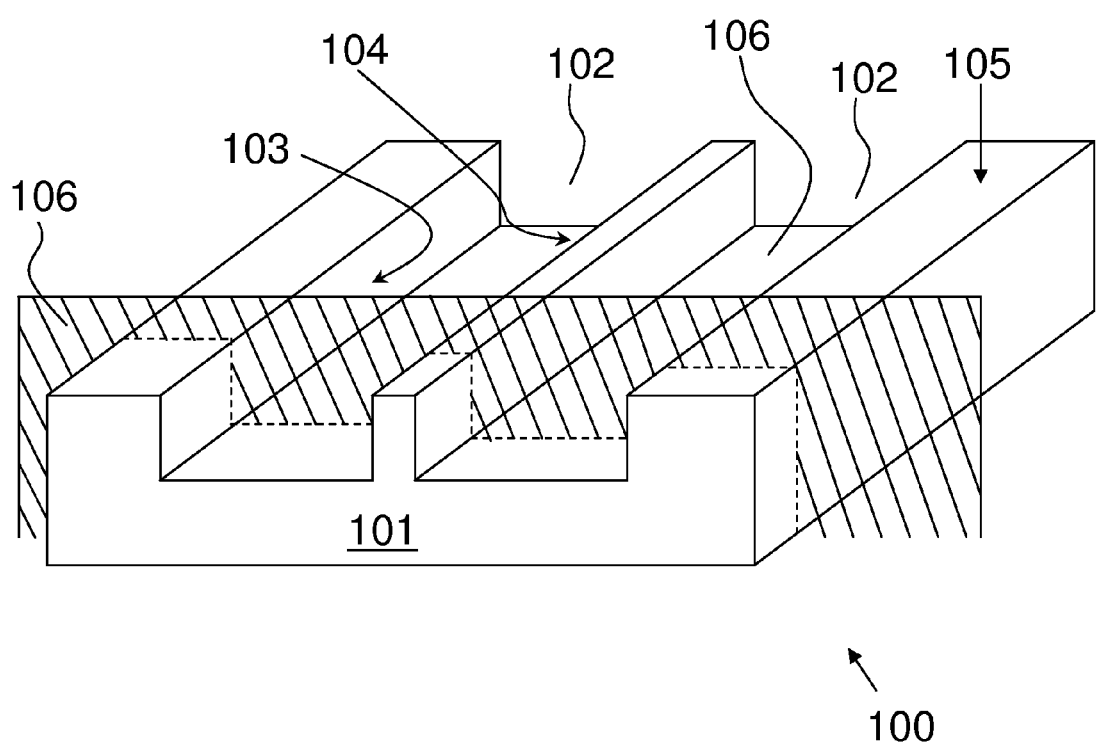
FIG. 1 is a perspective representation of a substrate having a substrate layer and an energetically neutral surface layer integrally disposed thereon, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

The following are definitions:

A monomer as used herein is a molecule that can undergo polymerization thereby contributing constitutional units to the essential structure of a macromolecule, an oligomer, a block, a chain, and the like.

A polymer as used herein is a macromolecule comprising multiple repeating smaller units or molecules (monomers) derived, actually or conceptually, from smaller units or molecules, bonded together covalently or otherwise. The polymer may be natural or synthetic.

A copolymer as used herein is a polymer derived from more than one species of monomer.

A block copolymer as used herein is a copolymer that comprises more than one species of monomer, wherein the monomers are present in blocks. Each block of the monomer comprises repeating sequences of the monomer. A formula (1) representative of a block copolymer is shown below:

$-(A)_a-(B)_b-(C)_c-(D)_d-$ (1)

wherein A, B, C, and D represent monomer units and the subscripts "a", "b", "c", and "d", represent the number of repeating units of A, B, C, and D respectively. The above referenced representative formula is not meant to limit the structure of the block copolymer used in an embodiment of the present invention. The aforementioned monomers of the copolymer may be used individually and in combinations thereof in accordance with the method of the present invention.

A di-block copolymer has blocks of two different polymers. A formula (2) representative of a di-block copolymer is shown below:

$-(A)_m-(B)_n-$ (2)

where subscripts "m" and "n" represent the number of repeating units of A and B, respectively. The notation for a di-block copolymer may be abbreviated as A-b-B, where A represents the polymer of the first block, B represents the polymer of the second block, and -b-denotes that it is a di-block copolymer of blocks of A and B. For example, PS-b-PEO represents a di-block copolymer of polystyrene (PS) and poly(ethylene oxide) (PEO).

A crosslinkable polymer as used herein is a polymer having a small region in the polymer from which at least one polymer chain may emanate, and may be formed by reactions involving sites or groups on existing polymers or may be formed by interactions between existing polymers. The small region may be an atom, a group of atoms, or a number of branch points connected by bonds, groups of atoms, or polymer chains. Typically, a crosslink is a covalent structure but the term is also used to describe sites of weaker chemical interactions, portions of crystallites, and even physical interactions such as phase separation and entanglements.

Morphology as used herein describes a form, a shape, a structure, and the like of a substance, a material, and the like as well as other physical and chemical properties (e.g., Young's Modulus, dielectric constant, etc. as described infra).

Amphiphilic as used herein is used to describe a molecule and a macromolecule that is or has in part both polar and non-polar portions that constitute the molecule and the macromolecule.

Thermosetting polymer as used herein is a polymer or a prepolymer in a soft solid or viscous state that changes irreversibly into an infusible, insoluble polymer network by curing. Typically, curing can be by the action of heat or radiation causing the production of heat, or both. Further, curing can be by the action of heat and/or radiation that produces heat resulting in the generation of a catalyst which serves to initiate crosslinking in the region of exposure.

Photosetting polymer as used herein is a polymer or a prepolymer in a soft solid or viscous state that changes irreversibly into an infusible, insoluble polymer network by curing. Typically, curing can be by the action of exposing the polymer or prepolymer to light (UV, IR, visible, etc). Further, curing can be by the action of exposure to radiation resulting in the generation of a catalyst which serves to initiate crosslinking in the region of exposure.

Nanostructure as used herein is a structure on the order of 1 nanometer (nm) to 100 nm in dimension. Examples of the structure may include but are not limited to nanorods, nanosheets, nanospheres, nanocylinders, nanocubes, nanoparticles, nanograins, nanofilaments, nanolamellae, and the like having solid composition and a minimal structural dimension in a range from about 1 nm to about 100 nm. Further examples of the structure may include but are not limited to spherical nanopores, cylindrical nanopores, nanotrenches, nanotunnels, nanovoids, and the like having their void or shape defined by the material or matrix that surrounds them and having a diameter in a range from about 1 nm to about 100 nm.

A substrate, as used herein, is a physical body (e.g., a layer or a laminate, a material, and the like) onto which a polymer or polymeric material may be deposited or adhered. A substrate may include materials of the Group I, II, III, and IV elements; plastic material; silicon dioxide, glass, fused silica, mica, ceramic, metals deposited on the aforementioned substrates, combinations thereof, and the like.

An energetically neutral surface layer, as used herein, is a surface layer whose chemical and morphological composition affords substantially no preferential or selective affinity for either polymer block in a block copolymer or an associated functional group or moiety, such as through ionic bonds, dipole-dipole forces, hydrogen bonding, and similar intermolecular forces.

FIG. 1 is a perspective representation of a substrate 100 having a substrate layer 101 and an energetically neutral surface layer 105 integrally disposed thereon. The surface layer 105 may be characterized by at least one trough 102, having a first sidewall 103 and a second sidewall 104 separated by a bottom surface 106 of the trough 102. The surface layer 105 may be characterized by a single trough 102 or a plurality of troughs. The sidewalls 103 and 104 may be substantially parallel to each other. The sidewalls 103 and 104 may be substantially normal to the surface layer 105. The at least one trough 102 may have a shape of a line, an arc, an angle, a combination thereof, and the like.

Figure 2:
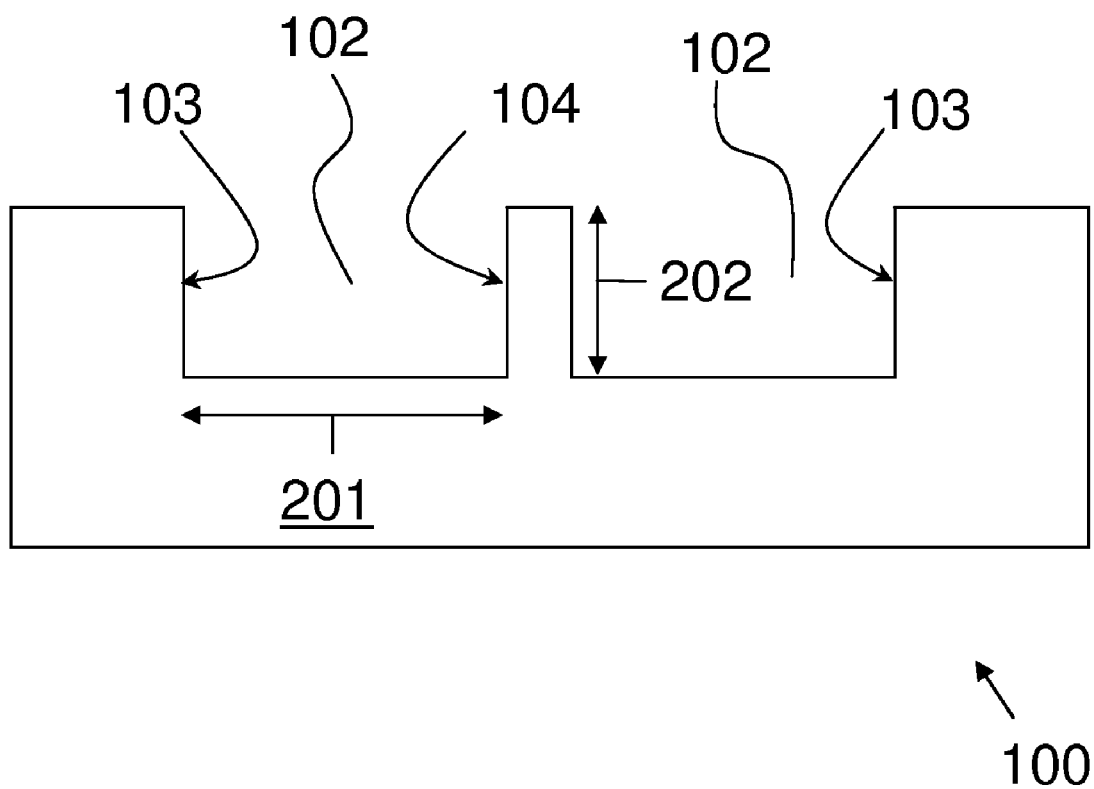
FIG. 2 is a cross-sectional view of a section of FIG. 1, in accordance with embodiments of the present invention.

FIG. 2 is a cross-sectional view of a section of FIG. 1 through plane 106. FIG. 2 shows an embodiment where sidewall 103 and sidewall 104 of trough 102 may have a height of 202 and be separated by a distance 201. The height 202 of sidewall 103 and 104 may be about 30 nanometers (nm) to about 200 nm, and separated by a distance 201 of about 20 nm to about 2000 nm.

These examples are not meant to limit the shape, size, or orientation of the topography of the surface layer 105. For example, the sidewall 103 and sidewall 104 may have different heights.

Figure 3:
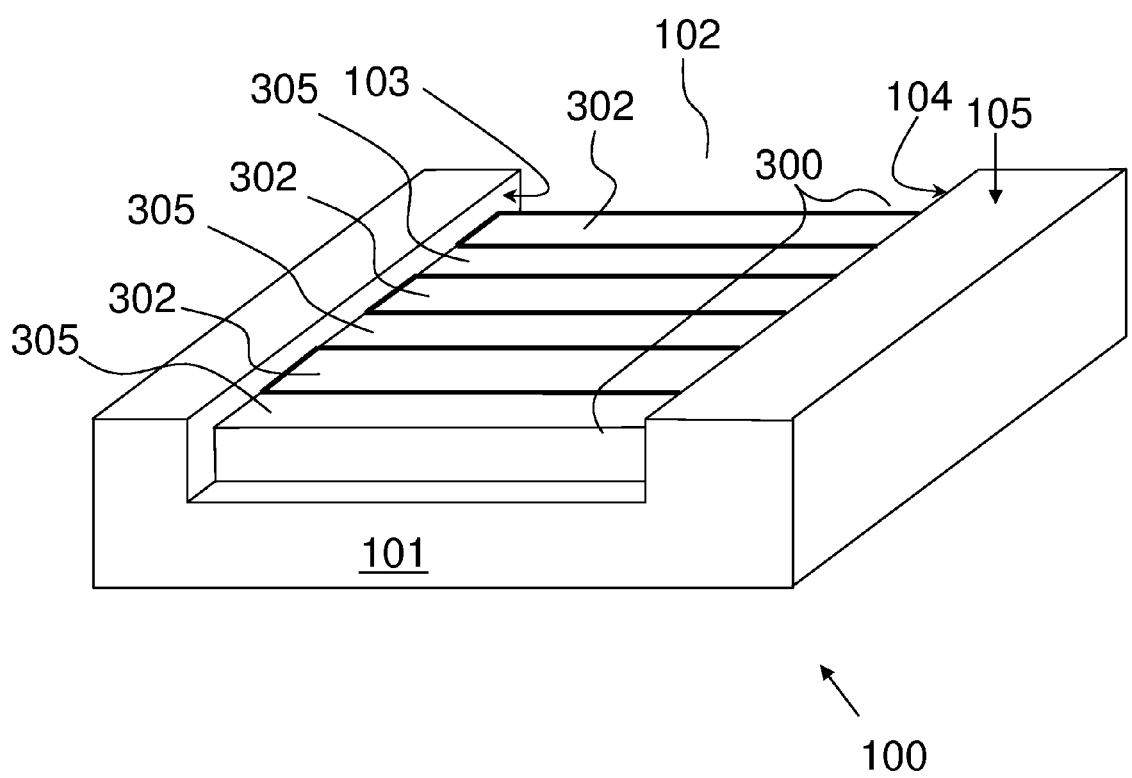
FIG. 3 depicts a substrate having an energetically neutral surface layer and at least one trough and sidewalls, in accordance with embodiments of the present invention.

FIG. 3 depicts an embodiment of the present invention with a substrate 100 having an energetically neutral surface layer 105 and at least one trough 102 and sidewalls 103 and 104. The trough may be coated with a film 300 of a block copolymer. The energetically neutral surface may induce the lamellae-forming block copolymer to align perpendicularly with respect to the substrate interfaces. Lamellae of the polymer blocks 302 and 305 of the block copolymer within the film may self-assemble and be induced to align with respect to the sidewalls 103 and 104, due to the high rigidity of one of the polymer block (302 or 305) and the long persistence length of the block copolymer microdomains. Self-assembled structures (nanostructures) of the first polymer block 305 and self-assembled structures (nanostructures) of the second polymer block 302, formed from aligned microdomains of aligned lamellae, may be oriented substantially normal to sidewalls 103 and 104 and substantially parallel to the surface layer 105. The same alignment principle may be applicable for line-forming morphology in the case of parallel cylinders. For example, with a trough with energetically neutral sidewalls and a preferentially wetted substrate, cylinder forming block copolymers may be used to generate lines which align perpendicularly to the trough sidewalls.

For example, rod-coil block copolymers such as polyhexylisocyanate-b-polystyrene and poly(phenylquinoline)-b-polystyene, may be used to form films where the high stiffness of one domain of these block copolymers will induce the line-forming structures to align substantially normal to the sidewalls of the trough and substantially parallel to the surface layer.

The rigidity of a particular polymer block (and microdomains thereof) in the block copolymer may be controlled by combining the block copolymer with a third material which is miscible with that particular block of the copolymer, where the miscible material may perform as a stiffening compound and increase the rigidity of that polymer block. The rigidity or stiffness of the microdomains of the polymer block may be controlled by using a different miscible material. Organic homopolymers, inorganic homopolymers, inorganic precursors, inorganic oligomers, crosslinkable homopolymers, or a combination of these may be used as the miscible material. The structure formed by the alignment of the line-forming microdomains of the block copolymer may be frozen when a crosslinkable material is used.

The morphology of the microdomains is determined by the Flory-Huggins interaction parameter between polymers A and B, molecular weight, and the volume fraction of A (or B). For a given block copolymer system, volume fraction may be the main parameter to determine the morphology. For example, for a di-block copolymer A-b-B, in general, when the polymer chain length of A is approximately the same as the polymer chain length of B, the di-block copolymer may form line-forming microdomains. The combined volumetric fraction of the first polymer block, A, and the miscible material with respect to the di-block copolymer may be in a range from about 0.2 to about 0.8. For block copolymers used in the present invention without a miscible material, the mole fraction of the minority block in the block copolymer may be about 0.2 to about 0.5.

After the film is formed, at least one microdomain may be removed from the film, leaving an oriented structure remaining in the trough. Processes that may be used may include thermolysis, UV/ozone processing, supercritical $CO_2$ processing, solvent extraction, a dry etching process, reactive ion etching, a wet etching process, and the like, and may be used individually and/or in combinations thereof in accordance with methods of the present invention. Removing at least one microdomain may comprise removing at least one domain from one or more polymer blocks of the block copolymer. For example, in the case of a di-block copolymer, the first polymer block, the second polymer block, or both may be removed.

If a miscible material is combined with the block copolymer, the block copolymer may be removed to leave an oriented structure in the trough. For example, in the case of a di-block copolymer, if the miscible material, which is selectively miscible with the first block of the block-copolymer, is an inorganic precursor, the film and substrate may be heated between about 350° C. and about 600° C. to remove all organic polymers from the film. The remaining material may form an oriented structure in the trough, since it may have been preferentially located in the microdomains of the first polymer block prior to the removal of the di-block copolymer. The remaining inorganic oriented structure may have substantially the same orientation as the associated self-assembled structures in which the miscible material was mixed, where the remaining structure may be substantially normal to the sidewalls, and substantially parallel to the surface layer. In an embodiment of the present invention, the remaining structure may be a nanostructure.

Figure 4:
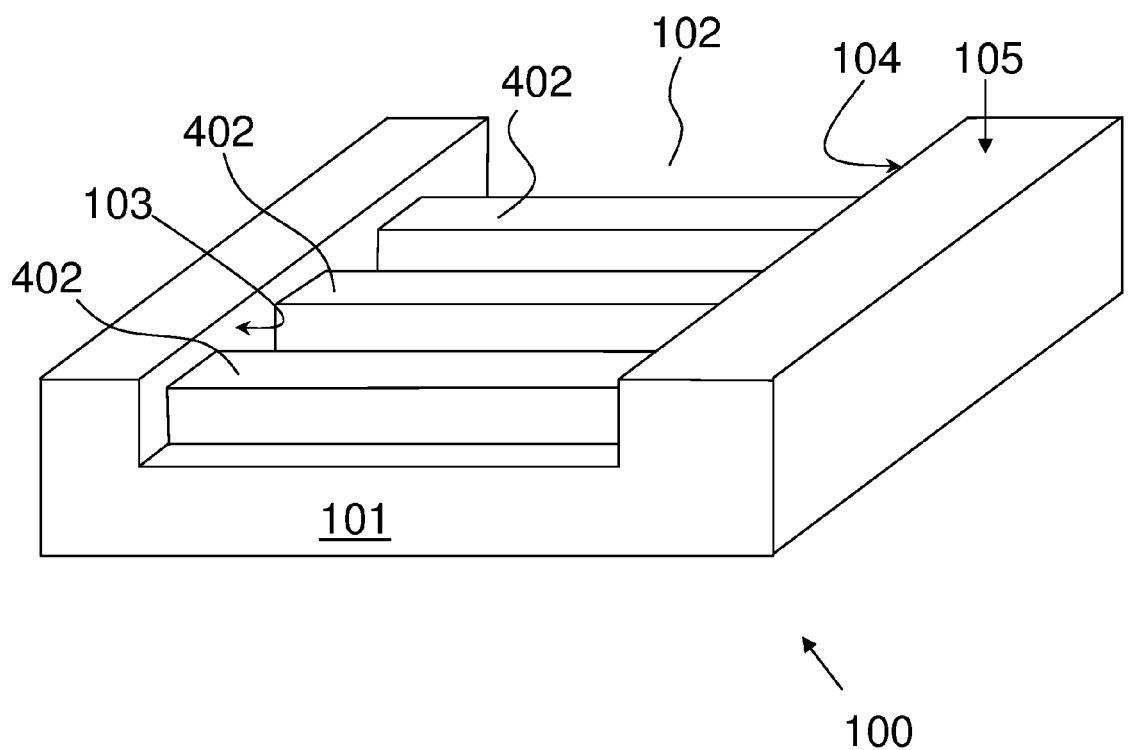
FIG. 4 depicts a substrate having an energetically neutral surface layer which may be characterized by at least one trough where an oriented structure remains in the trough, in accordance with embodiments of the present invention.

FIG. 4 depicts a substrate 100 having an energetically neutral surface layer 105 which may be characterized by at least one trough, whereupon an oriented structure 402, derived from 305 in FIG. 3, remains in the trough after the removal of at least one microdomain from the film. The structure 402 may be oriented substantially normal to sidewalls 103 and 104 and substantially parallel to the surface layer 105.

After the removal of at least one microdomain from the first film, a second film of a second combination, formed from a second block copolymer, may be applied in the trough on the energetically neutral surface, in a similar manner to the first film. The second film may substantially cover the first oriented structure in the trough and fill gaps between sections from where at least one microdomain of the first film has been removed. The microdomains of the second block copolymer may assemble in the second film to form self-assembled structures which may be oriented substantially normal to the first oriented structure formed after the application of the first film, where the first oriented structure provides a guiding topography for the self-assembled structures of the second film. At least one microdomain of the second film may be removed to leave a second oriented structure remaining in the trough, where the second structure may be oriented substantially parallel to the sidewalls of the trough and substantially normal to the first oriented structure.

Figure 5:
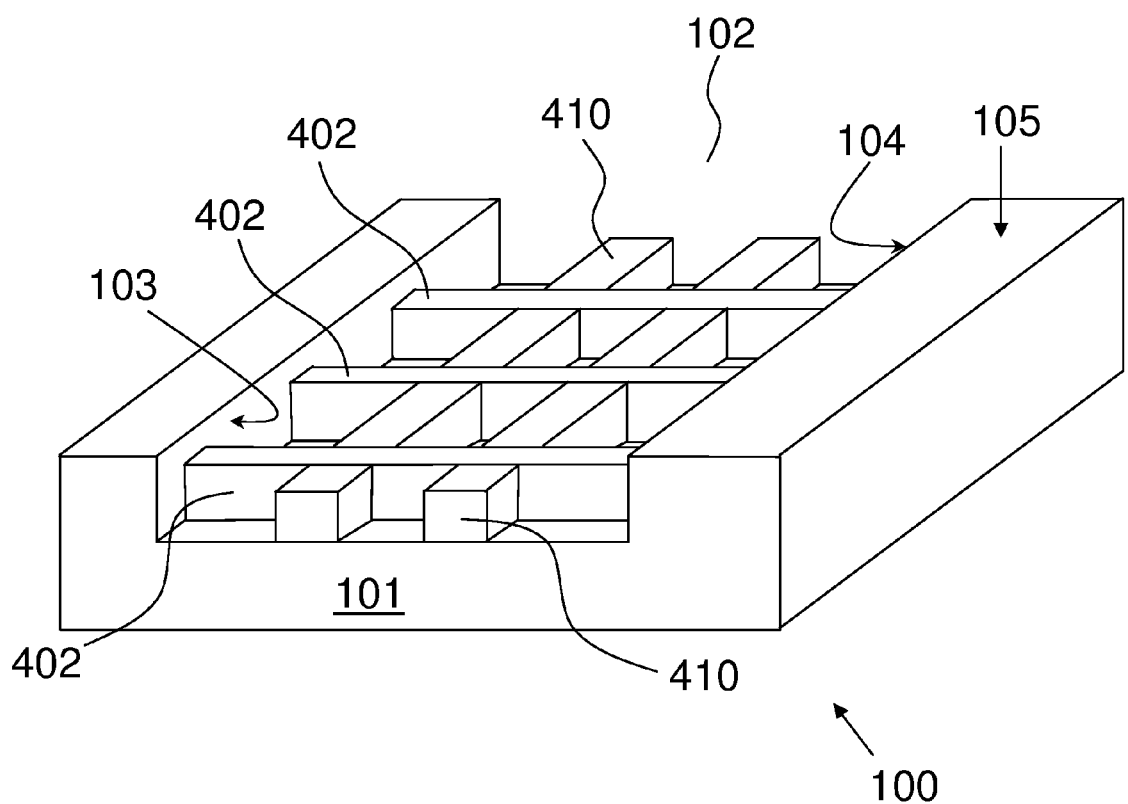
FIG. 5 is an illustration of the substrate of FIG. 4 after the application of a second film in the trough where at least one microdomain has been removed from the second film, in accordance with embodiments of the present invention.

FIG. 5 is an illustration of the substrate 100 of FIG. 4 after the application of a second film in the trough 102 of a second block copolymer, where at least one microdomain from the second film has been removed to leave a second oriented structure 410 in the trough 102. The second oriented structure 410 may be oriented substantially normal to the first oriented structure 402 and substantially parallel to the first sidewall 103 and the second sidewall 104.

Figure 6:
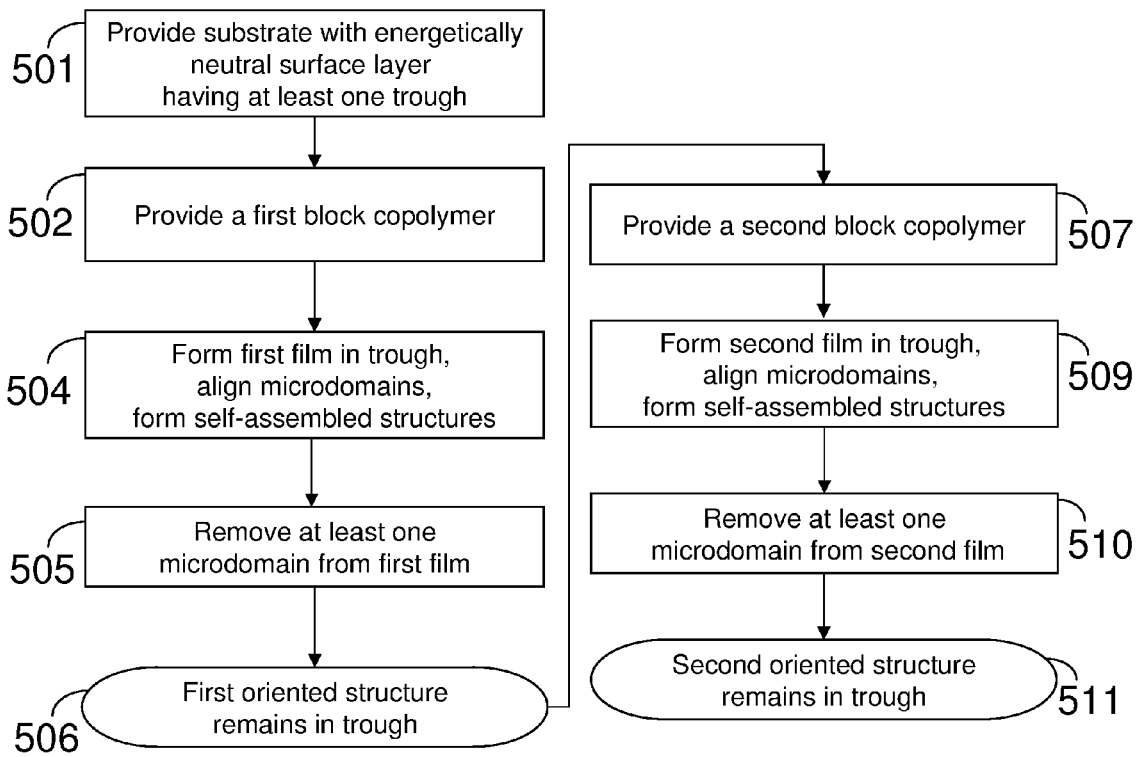
FIG. 6 is a flowchart which illustrates generalized method steps, in accordance with embodiments of the present invention.

FIG. 6 is a flowchart which illustrates generalized method steps 501 to 511 for an embodiment of the present invention. Step 501 provides a substrate with an energetically neutral surface layer having at least one trough such as in FIG. 1 and FIG. 2. Step 502 provides a first block copolymer. Step 504 forms a first film in the trough, aligns line-forming microdomains of the first block copolymer and forms self-assembled structures, such as illustrated in FIG. 3. The first film may comprise the first block copolymer or a combination of the first block copolymer with a first miscible material, wherein the first miscible material acts as a stiffening compound and increases the rigidity of one of the blocks of the first block copolymer in which the miscible material is preferentially miscible. Step 505 removes at least one microdomain from the first film, resulting in first oriented structures remain in the trough as in step 506. The oriented structures may, for example, resemble the structures 402 of FIG. 4, where the structures 402 are substantially parallel to the sidewalls 103 and 104 and are substantially parallel to the surface layer 105.

Step 507 provides a second block copolymer. The second block copolymer may be different from the first block copolymer. In step 509, a second film is formed in the trough, after which line-forming microdomains of the second block copolymer are aligned to form self-assembled structures in the film. In step 510, at least one microdomain of the second block copolymer is removed from the second film, resulting in second oriented structure remains in the trough, as in 511, where the second oriented structure remaining in 511 may be aligned substantially normal to the first oriented structure, and substantially parallel to the surface layer. As above, the second film may comprise the second block copolymer or a combination of the second block copolymer combined with a second miscible material, where the second miscible material may be preferentially miscible with one block of the second block copolymer, and may act as a stiffening compound and increase the rigidity of that block.

EXAMPLES

Figures 7A, 7B:
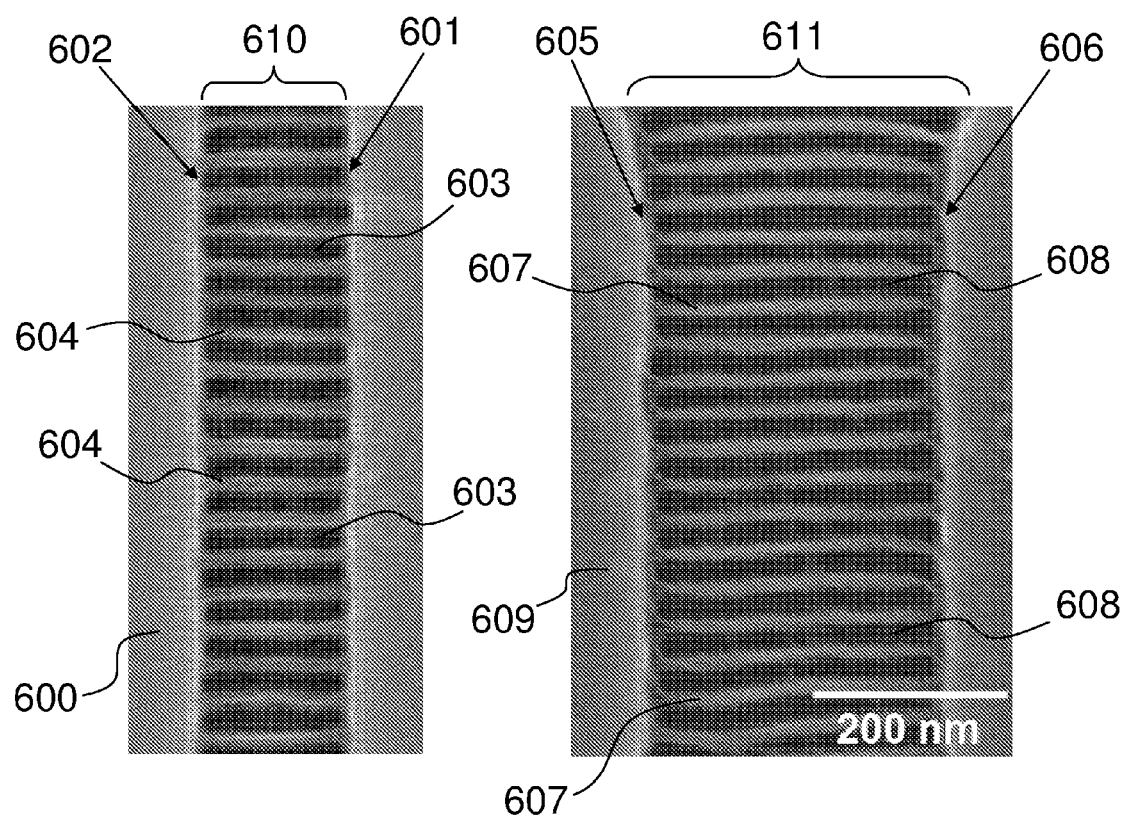
FIG. 7A is a scanning electron microscope (SEM) image of a structure in a trough on an energetically neutral surface layer of a substrate, formed from a film of a combination of a block copolymer and a miscible material, in accordance with embodiments of the present invention.
FIG. 7B is an SEM image of a structure in a trough on an energetically neutral surface layer of a substrate, formed from a film, where the separation between sidewalls is greater than the separation between sidewalls in FIG. 7A, in accordance with embodiments of the present invention.

FIG. 7A is a scanning electron microscope (SEM) image of a structure 604 in a trough 610 on an energetically neutral surface layer 600 of a substrate, formed from a film of a combination of an amphiphilic di-block copolymer, polystyrene-block-poly(ethylene oxide) (herein referred to as PS-b-PEO) and a miscible material, poly(methylsilsesquioxane), hereafter referred to as PMSSQ. The PS-b-PEO comprised a first block of a first polymer, PEO, and a second block of a second polymer, PS, where the molecular weight of the PS block was about 19,000 grams/mole (g/mol), and the molecular weight of the PEO block was about 12,000 g/mol. The composition of the PS-b-PEO may vary in the amount of PS block and PEO block present in the PS-b-PEO di-block copolymer, where the molecular weight of each block of the di-block copolymer may be in a range from about 2,000 g/mol to about 100,000 g/mol. The total molecular weight of block copolymers in the present invention may range from about 10,000 g/mol to about 200,000 g/mol. The fractions of the monomer blocks present can be represented in percent millimoles (% mmol.), percent by weight (wt. %), volume fraction, and the like. The combined volumetric fraction of the PEO+PMSSQ block present in the combination was about 0.65. The PMSSQ provided is preferentially miscible with the PEO block of PS-b-PEO over the PS, and may act as a stiffening compound to increase the stiffness or rigidity of the PEO block in the di-block copolymer and the PEO microdomains in the formed film.

The combination of PS-b-PEO and PMSSQ was spin coated into the trough 610 on the substrate having an energetically neutral surface layer 600, at a spin speed of about 3,000 rotations per minute (rpm). The PMSSQ, which is miscible with PEO and immiscible with PS, may reside in or next to PEO microdomains. The volume fraction of PEO+ PMSSQ phase, which is determined by the chain length of each block of the di-block copolymer and combination composition, may determine the morphology of the combinations. Horizontal light lines 604 in the image are the remaining aligned inorganic structure after organic polymer has been removed by heating the film to 450° C. Dark horizontal lines 603 in FIG. 6A are gaps formed where the PS lamellar microdomains of the organic di-block copolymer were removed. Since the PMSSQ is selectively miscible in the PEO microdomains relative to the PS microdomains, removal of the PS microdomains leaves a space or gap. As seen in the images, the ordered structure 604 remaining in the trough 610 is oriented substantially normal to the sidewalls 601 and 602 of the trough 610 and substantially parallel to the surface layer 600.

FIG. 7B is an SEM image of a structure 607 in a trough 611 on an energetically neutral surface layer 609 of a substrate, formed from a film of a combination of PS-b-PEO and PMSSQ, prepared in a similar fashion as the sample shown in FIG. 7A, where the separation between sidewalls 605 and 606 in FIG. 7B is greater than the separation between sidewalls 602 and 601 in FIG. 7A. Horizontal light lines 607 in the image are the remaining aligned inorganic structure after organic polymer has been removed by heating the film to 450° C. Dark horizontal lines 608 in FIG. 7B are gaps formed where the PS lamellar microdomains of the organic di-block copolymer were removed by heating the sample to 450° C. Since the PMSSQ is selectively miscible in the PEO microdomains relative to the PS microdomains, removal of the PS microdomains leaves a space or gap. As seen in the images, the ordered structure 607 remaining in the trough 611 is oriented substantially normal to the sidewalls 605 and 606 of the trough 611 and substantially parallel to the surface layer 609.

Figure 8:
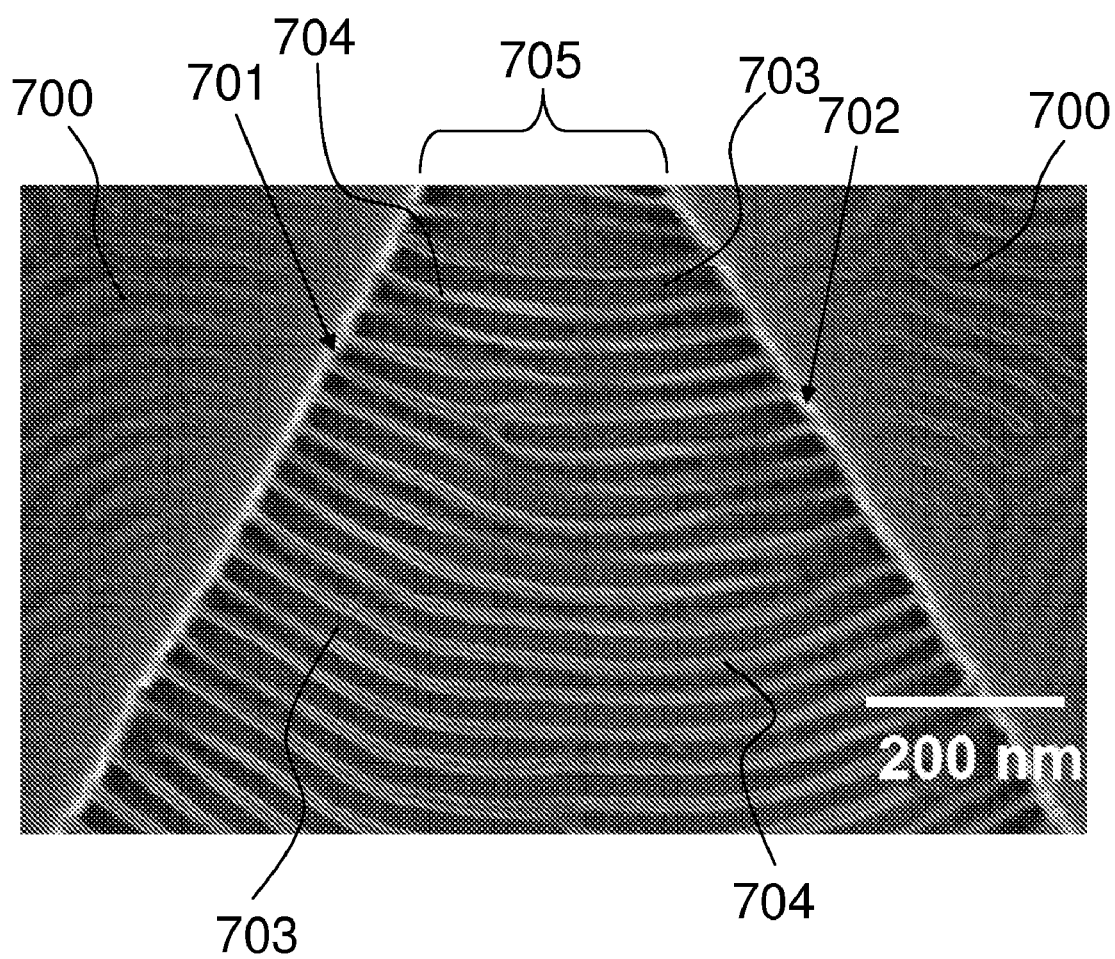
FIG. 8 is an SEM image of an oriented structure 704 on an energetically neutral surface layer of a substrate having at least one trough, where the trough has the shape of an angle and the sidewalls are not parallel to each other, in accordance with the embodiments of the present invention.

FIG. 8 is an SEM image of an oriented structure 704, prepared in a similar manner to those shown in FIG. 7A and FIG. 7B, on an energetically neutral surface layer 700 of a substrate having at least one trough 705, formed from a film of a combination of PS-b-PEO and PMSSQ, where the trough 705 has the shape of an angle and the sidewalls 701 and 702 are not parallel to each other. Light lines 704 are the oriented structure remaining in the trough 705 after removal of organic polymer by heating the sample to 450° C. Dark lines 703 are gaps between the remaining structures where organic polymer has been removed. The oriented structure 704 is substantially normal to the sidewalls 701 and 702, and substantially parallel to the surface layer 700.

Figure 9:
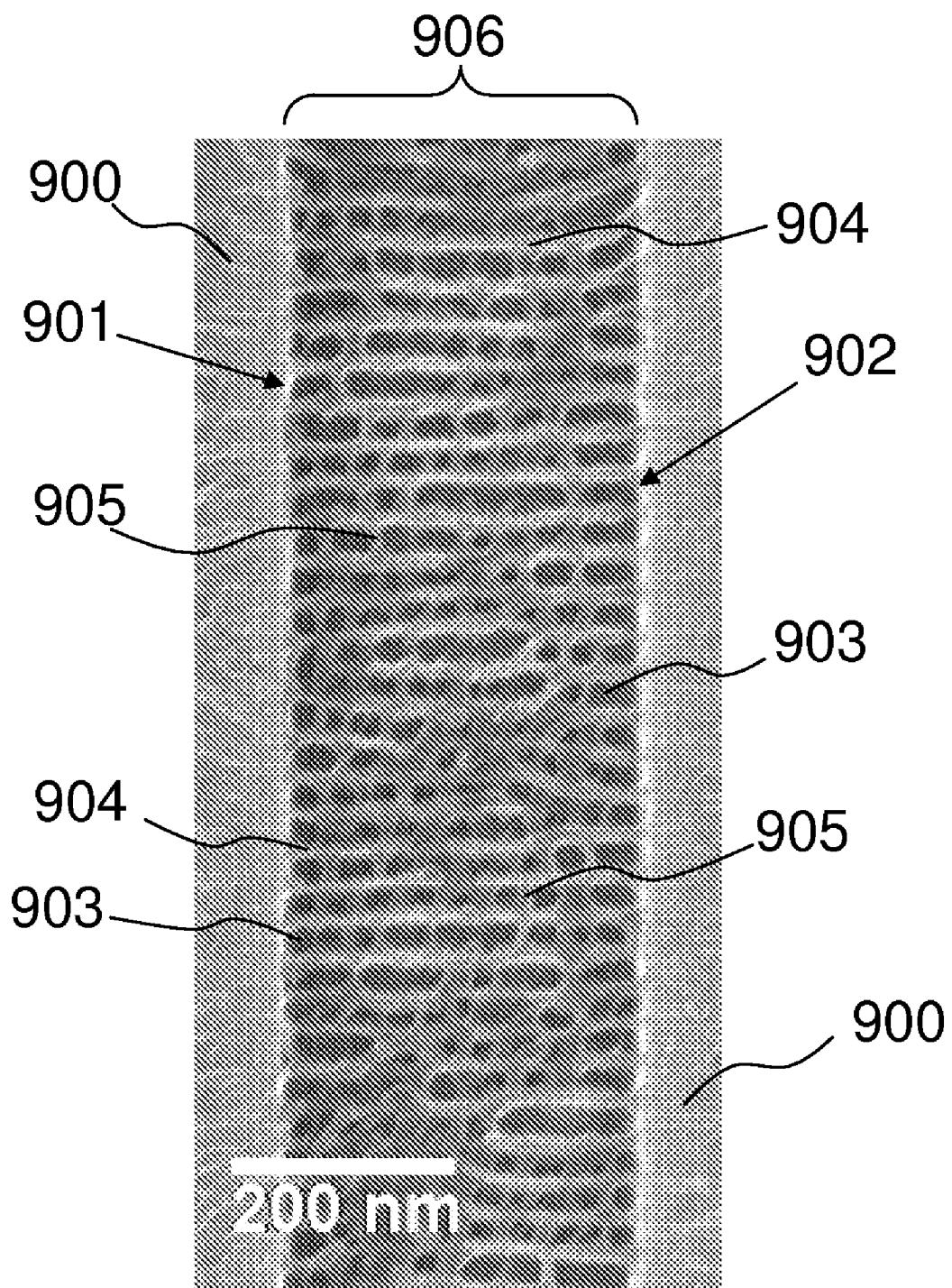
FIG. 9 is an SEM image of a structure in a trough on an energetically neutral surface layer of a substrate, in accordance with embodiments of the present invention.

FIG. 9 is an SEM image of a structure 904 and 905 in a trough 906 on an energetically neutral surface layer 900 of a substrate. The structure 904 was prepared as described above by spin coating (30 seconds @ 3000 rpm) a combination of PS-b-PEO and PMSSQ to form a first film in the trough 906, followed by heating to 450° C. to remove organic material, where the first oriented inorganic structure 904 remained in the trough. The first oriented structure 904 is oriented substantially perpendicular to sidewalls 901 and 902. A second film of a second combination of PS-b-PEOP with PMSSQ was then formed in the trough 906 by spin coating as above, followed by heating to 450° C. to remove organic material to leave a second oriented structure 905 remaining in the trough 906. The second oriented structure 905 is substantially perpendicular to the first oriented structure 904 and substantially parallel to the sidewalls 901 and 902. Dark spaces 903 are gaps formed where the PS lamellar microdomains of the organic di-block copolymer were removed.

The trough on an energetically neutral surface layer may be prepared using electron beam (e-beam) lithography. The use of e-beam lithography is not meant to limit the technique that can be used to create a trough in the surface layer. Alternative processes may include but are not limited to chemical vapor deposition (CVD), plasma deposition, stereolithography, photolithography, sputtering, nanoimprinting, and any other means for creating a trough in a surface layer. A trough in a surface layer may be made energetically neutral by the deposition of a thin film of appropriate chemical composition. In addition, the trough in the surface layer may not necessarily be integrally disposed upon the substrate layer and may be created by the deposition or layering of additional material on the surface layer in a pattern to create a trough.

The use of PS-b-PEO as the di-block copolymer is not meant to limit the type of the di-block copolymer that may be used in embodiments of the present invention. The di-block copolymer may be but is not limited to an amphiphilic organic di-block copolymer, an amphiphilic inorganic di-block copolymer, a combination thereof, and the like. Specific examples of a first polymer of a di-block copolymer may include but are not limited to poly(ethylene oxide), poly(propylene glycol), poly(alkylene oxides), poly(acrylic acids), poly(methacrylic acid), poly(dimethylamino ethylmethacrylate), poly(hydroxyalkyl methacrylates), poly(alkyleneoxide acrylates), poly(alkyleneoxide methacrylates), poly(hydroxyl styrenes), polycarbohydrates, poly(vinyl alcohols), poly(ethylene imines), polyoxazolines, polypeptides, poly (vinyl pyridines), polyacrylamides, poly(methyl vinyl ethers), poly(vinyl carboxylic acid amides), polymethylmethacrylate, poly(N,N-dimethylacrylamides), combinations thereof, and the like. Specific examples of a second polymer of a di-block copolymer may include but are not limited to polystyrene, poly(U-methyl styrene), polynorbornene, polylactones, polylactides, polybutadiene, polyisoprene, polyolefins, polymethacrylates, polysiloxanes, poly (alkyl acrylates), poly(alkyl methacryaltes), polyacrylonitriles, polycarbonates, poly(vinyl acetates), poly (vinyl carbonates), and polyisobutylenes, combinations thereof, and the like. Di-block copolymers formed from the aforementioned first and second polymers may be used individually and in combinations thereof in accordance with the method of the present invention.

The use of PMSSQ as a miscible material in this example is not meant to limit the type of the crosslinkable material that may be used in an embodiment of the present invention. Other materials that may be used include but are not limited to inorganic precursors, organic homopolymers, crosslinkable homopolymers, combinations thereof, and the like. The inorganic precursor may be silsesquioxane having the formula $(RSiO_{1.5})_n$, wherein R may be a hydrido group or an alkyl group having 1 to 3 carbon atoms, wherein n may be in a range from about 10 to about 500, and wherein the crosslinkable homopolymer may have a molecular weight in a range from about 600 g/mol to about 30,000 g/mol. Crosslinkable homopolymers may include organic crosslinkable polymers; inorganic crosslinkable polymers; inorganic precursors, thermosetting crosslinkable polymers such as epoxy resins, phenolic resins, amino resins, bis-maleimide resins, dicyanate resins, allyl resins, unsaturated polyester resins, polyamides, and the like; photosetting crosslinkable polymers; polysilanes; polygermanes; carbosilanes; borazoles; carboranes; amorphous silicon carbides; carbon doped oxides; and the like. The aforementioned crosslinkable polymers may be used individually and in combinations thereof in accordance with the method of the present invention.

The combination of the block copolymer and the miscible material may be formed in a solvent solution and cast as a solution, which may require solvent removal for complete film formation. A thin film of the combination may be spin coated onto a substrate, where a spin speed may be in a range from about 1 rpm to about 5,000 rpm. The combination may be spin coated at room temperature without a post-drying process. Alternatively, a film sample on a substrate may be thermally annealed, after forming the film, at a temperature of about 100° C. for about 10 hours, for example. Also, a film sample on a substrate may be vapor annealed, after forming the film on the substrate, by annealing the adhering film under organic solvent vapor at room temperature (about 25° C.) from about 10 hours to about 15 hours, for example. Lamellar microdomains may assemble during or after film formation in the trough. Likewise, formation of the associated self-assembled structures may occur during formation of the block copolymer film or after the film has been formed and the energetically neutral surface.

The spin coating process used is not meant to limit the type of processes that may be used when forming a film in an embodiment of the present invention. Other processes such as chemical vapor deposition (CVD), photochemical irradiation, thermolysis, spray coating, dip coating, doctor blading, and the like may be used individually and in combinations thereof in accordance with the method of the present invention.

The formation of the self-assembled structures of line-forming microdomains such as lamellar microdomains and cylindrical microdomains may be accomplished by forming the film on the substrate through spin-casting, dip-coating and spray-coating, thermal annealing after forming the film on the substrate, vapor annealing after forming said film on the substrate, a combination thereof, or any other process which provides a means for forming the structures.

The foregoing description of the embodiments of this invention has been presented for purposes of illustration and description. It is not intended to be exhaustive or to limit the invention to the precise form disclosed, and obviously, many modifications and variations are possible. For example, the miscible material may be selected to be preferentially miscible with the second block of the block copolymer. Such modifications and variations that may be apparent to a person skilled in the art are intended to be included within the scope of this invention as defined by the accompanying claims.

What is claimed:

1. A method, comprising:

forming a first film inside at least one trough, said at least one trough integrally disposed on an energetically neutral surface layer of a substrate, said at least one trough comprising a substantially planar first sidewall and a substantially planar second sidewall opposite said first sidewall, wherein said first sidewall and said second sidewall are substantially normal to said energetically neutral surface layer, said first and said second sidewalls being separated by a distance corresponding to a width of a bottom surface of said at least one trough, said first film comprising a first block copolymer;

assembling line-forming microdomains of said first block copolymer within said first film, said line-forming microdomains of said first block copolymer forming first self-assembled structures within said first film, said first self-assembled structures oriented substantially normal to said first sidewall and said second sidewall and substantially parallel to said energetically neutral surface layer;

removing at least one microdomain from said first film such that oriented structures remain in said trough, wherein said oriented structures are oriented substantially normal to said first sidewall and said second sidewall and substantially parallel to said surface layer;

forming a second film inside said at least one trough, said second film comprising a second block copolymer; and assembling line-forming microdomains of said second block copolymer within said second film, said line-forming microdomains of said second block copolymer forming second self-assembled structures within said second film, said second self-assembled structures oriented substantially normal to said oriented structures and substantially parallel to said first sidewall and said second sidewall.

2. The method of claim 1, wherein said first block copolymer and said second block copolymer are different.

3. The method of claim 1, wherein said first sidewall is substantially parallel to said second side wall, wherein said first sidewall and said second sidewall are separated by a distance within a range from about 20 nanometers (nm) to about 2000 nm, wherein said at least one trough has a depth within a range from about 30 nm to about 200 nm.

4. The method of claim 1, wherein said forming said first film and said forming said second film are processes selected from the group consisting of dip coating, spray coating, spin coating, and combinations thereof.

5. The method of claim 1, wherein said first block copolymer and said second block copolymer are amphiphilic organic block copolymers, amphiphilic inorganic block copolymers, or combinations thereof.

6. The method of claim 1, wherein said removing at least one microdomain from said first film comprises using a process selected from the group consisting of thermolysis, UV/ozone processing, supercritical $CO_2$ processing, solvent extraction, a dry etching process, a wet etching process, reactive ion etching, and combinations thereof.

7. The method of claim 1, wherein said first film further comprises a first miscible material, wherein said first miscible material is miscible with said first block copolymer, wherein presence of said first miscible material within said first block copolymer induces line-forming microdomains of said first block copolymer to align with respect to said first sidewall and said second sidewall, after said first film is formed inside said at least one trough, and wherein said second film comprises a combination of said second block copolymer and a second miscible material, wherein said second miscible material is miscible with said second block copolymer, wherein presence of said second miscible material with said second block copolymer induces line-forming microdomains of said second block copolymer to align with respect to said oriented structures, after said second film is formed inside said at least one trough.

8. The method of claim 7, wherein said first miscible material and said second miscible material increase the rigidity of line-forming microdomains of said first block of said first polymer and said first block of said third polymer, respectively, wherein said first miscible material and said second miscible material are each selected from the group consisting of organic homopolymers, inorganic homopolymers, crosslinikable homopolymers, inorganic oligomers, and combinations thereof.

9. The method of claim 1, wherein said first block copolymer is a di-block copolymer comprising a first block of a first polymer, said first block of the first polymer being covalently bonded to a second block of a second polymer to form a repeating unit of said first block copolymer, said first and second polymers being different, further wherein said second block copolymer is a di-block copolymer comprising a first block of a third polymer, said first block of said third polymer being covalently bonded to a second block of a fourth polymer to form a repeating unit of said second block copolymer, said third and fourth polymers being different.

10. The method of claim 9, wherein said first polymer and said third polymer are selected from the group consisting of poly(ethylene oxide), poly(propylene glycol), poly(alkylene oxides), poly(acrylic acids), poly(methacrylic acid), poly (dimethylamino ethylmethacrylate), poly(hydroxyalkyl methacrylates), poly(alkyleneoxide acrylates), poly(alkyleneoxide methacrylates), poly(hydroxyl styrenes), polycarbohydrates, poly(vinyl alcohols), poly(ethylene imines), polyoxazolines, polypeptides, poly(vinyl pyridines), polyacrylamides, poly(methyl vinyl ethers), poly(vinyl carboxylic acid amides), polymethylmethacrylate, and poly(N, N-dimethylacrylamides), wherein said second polymer and said fourth polymer are selected from the group consisting of polystyrene, poly($\alpha$-methyl styrene), polynorbomene, polylactones, polylactides, polybutadiene, polyisoprene, polyolefins, polymethacrylates, polysiloxanes, poly(alkyl acrylates), poly(alkyl methacryaltes), polyacrylonitriles, polycarbonates, poly(vinyl acetates), poly(vinyl carbonates), and polyisobutylenes.

11. The method of claim 10, wherein said at least one microdomain from said first film is selected from the group consisting of at least one microdomain of said first polymer block and at least one microdomain of said second polymer block.

12. A method, comprising:

forming a film in at least one trough, said at least one trough having at least one first oriented structure disposed therein, said at least one trough integrally disposed on a surface layer of a substrate, said surface layer configured to induce a block copolymer to form line-forming microdomains, said at least one trough comprising a substantially planar first sidewall and a substantially planar second sidewall opposite said first sidewall, wherein said first sidewall and said second sidewall are substantially normal to said surface layer, said first and said second sidewalls being separated by a distance corresponding to a width of a bottom surface of said at least one trough, said at least one first oriented structure oriented substantially normal to said first sidewall and said second sidewall and substantially parallel to said surface layer, said film comprising a block copolymer, said block copolymer comprising line-forming microdomains of a first polymer block and lamellar microdomains of a second polymer block; and removing at least one microdomain from said film such that at least one second oriented structure remains in said at least one trough, wherein said at least one second oriented structure is oriented substantially normal to said at least one first oriented structure and substantially parallel to said first sidewall and said second sidewall.

13. The method of claim 12, wherein said film further comprises a miscible material, wherein said miscible material is miscible with said block copolymer, wherein said miscible material is dissolved within said first polymer block.

14. The method of claim 13, wherein said miscible material is selected from the group consisting of an organic homopolymer, an inorganic homopolymer, a crosslinikable homopolymer, inorganic oligomers, and combinations thereof, wherein said crosslinikable homopolymer, wherein said crosslinikable homopolymer is a silsesquioxane having the formula $(RSiO_{1.5})_n$, wherein R is selected from the group consisting of a hydrido group and an alkyl group, wherein n is in a range from about 10 to about 500, and wherein said crosslinkable homopolymer has a molecular weight in a range from about 600 grams/mole (g/mol) to about 30,000 g/mol.

15. The method of claim 13, wherein said miscible material is an inorganic homopolymer, and wherein said removing at least one microdomain from said film comprises removing all organic polymer from said film by heating said film to a temperature between 350° C. and 600° C.

* * * * *